(12) United States Patent
Kenworthy et al.

(10) Patent No.: US 8,469,368 B2
(45) Date of Patent: Jun. 25, 2013

(54) EDGE RINGS FOR ELECTROSTATIC CHUCKS

(75) Inventors: Ian Jared Kenworthy, Mountain View, CA (US); Kelly Fong, San Mateo, CA (US); Michael C. Kellogg, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 933 days.

(21) Appl. No.: 12/540,186

(22) Filed: Aug. 12, 2009

(65) Prior Publication Data

US 2010/0044974 A1 Feb. 25, 2010

Related U.S. Application Data

(60) Provisional application No. 61/090,182, filed on Aug. 19, 2008.

(51) Int. Cl.
*B23B 31/28* (2006.01)

(52) U.S. Cl.
USPC ............................ 279/128; 361/234; 414/941

(58) Field of Classification Search
USPC ............................ 279/128; 361/234; 414/941
IPC ......................................................... B23B 31/28
See application file for complete search history.

(56) References Cited

U.S. PATENT DOCUMENTS

| 2,855,769 | A | * | 10/1958 | Garnier | 464/31 |
| 3,367,638 | A | * | 2/1968 | Leva | 261/113 |
| 4,130,379 | A | * | 12/1978 | Partington | 416/193 A |
| 5,805,408 | A | * | 9/1998 | Maraschin et al. | 361/234 |
| 6,133,152 | A | * | 10/2000 | Bierman et al. | 438/706 |
| 6,475,336 | B1 | * | 11/2002 | Hubacek | 156/345.51 |
| 6,506,291 | B2 | * | 1/2003 | Tsai et al. | 204/298.15 |

(Continued)

FOREIGN PATENT DOCUMENTS

| JP | 07094480 | 4/1995 |
| JP | 2004289003 | 10/2004 |
| WO | WO-2010021890 A2 | 2/2010 |
| WO | WO-2010021890 A3 | 5/2010 |

OTHER PUBLICATIONS

"International Application Serial No. PCT/US2009/053579, Search Report mailed Mar. 22, 2010", 3 pgs.

(Continued)

*Primary Examiner* — Eric A Gates
*Assistant Examiner* — Bayan Salone
(74) *Attorney, Agent, or Firm* — Schwegman Lundberg & Woessner, P.A.

(57) ABSTRACT

A disclosed device for use with an electrostatic chuck configured to hold a substrate in a plasma environment comprises an edge ring configured to be placed either in contact with portions of only a ceramic top piece, a base plate, or coupled to the base plate through a plurality of pins and pin slots. The edge ring is further configured to be concentric with the ceramic top piece. In one embodiment, the edge ring includes an inner edge having an edge step arranged to provide mechanical coupling between the edge ring and the outer periphery of the ceramic top piece. The edge ring further includes an outer edge and a flat portion located between the inner edge and the outer edge. The flat portion is arranged to be both horizontal when the edge ring is placed around the outer periphery of the ceramic top piece and parallel to the substrate.

30 Claims, 7 Drawing Sheets

U.S. PATENT DOCUMENTS

| | | | |
|---|---|---|---|
| 6,700,099 B2 * | 3/2004 | Cole et al. | 219/444.1 |
| 7,029,529 B2 * | 4/2006 | Law et al. | 118/211 |
| 7,480,129 B2 * | 1/2009 | Brown et al. | 361/234 |
| 7,589,950 B2 * | 9/2009 | Parkhe et al. | 361/234 |
| 2002/0187647 A1 * | 12/2002 | Dhindsa et al. | 438/710 |
| 2005/0219786 A1 * | 10/2005 | Brown et al. | 361/234 |
| 2006/0016561 A1 * | 1/2006 | Choi et al. | 156/345.51 |
| 2006/0115600 A1 * | 6/2006 | Muto et al. | 427/448 |
| 2007/0231992 A1 * | 10/2007 | Balasubramaniam | 438/227 |
| 2007/0235420 A1 | 10/2007 | Yamazawa | |
| 2007/0258186 A1 * | 11/2007 | Matyushkin et al. | 361/234 |
| 2008/0089001 A1 * | 4/2008 | Parkhe et al. | 361/234 |
| 2010/0078899 A1 * | 4/2010 | Povolny et al. | 279/128 |
| 2011/0126984 A1 * | 6/2011 | Kang et al. | 156/345.51 |

OTHER PUBLICATIONS

"International Application Serial No. PCT/US2009/053579, Written Opinion mailed Mar. 22, 2010", 4 pgs.

* cited by examiner

DETAIL A

DETAIL B

DETAIL C

EDGE RINGS FOR ELECTROSTATIC CHUCKS

CLAIM OF PRIORITY

The present application claims the benefit under 35 U.S.C. 119(e) of U.S. Provisional Patent Application Ser. No. 61/090,182, filed Aug. 19, 2008, which is incorporated herein by reference in its entirety.

TECHNICAL FIELD

The present invention relates generally to the field of process equipment used in the semiconductor, data storage, flat panel display, as well as allied or other industries. More particularly, the present invention relates to a system for enhancing performance of electrostatic chucks used in plasma-based process tools.

BACKGROUND

Semiconductor device geometries (i.e., integrated circuit design rules) have decreased dramatically in size since integrated circuit (IC) devices were first introduced several decades ago. ICs have generally followed "Moore's Law," which means that the number of devices fabricated on a single integrated circuit chip doubles every two years. Today's IC fabrication facilities are routinely producing 65 nm (0.065 μm) feature size devices, and future fabs will soon be producing devices having even smaller feature sizes.

As IC design rules shrink, an increasing trend in semiconductor manufacturing is utilizing single-wafer processing for a variety of fabrication steps, including plasma etching and deposition chambers. Single-wafer reactors must be designed to unobtrusively secure the wafer (or other substrate-type) during processing, while controlling both temperature and temperature uniformity across the wafer.

Mechanical wafer clamps which engage a portion of front surfaces of the wafer where processing is to be performed potentially create process uniformity problems by interfering with gas flow, altering plasma distribution, and acting as a heat sink. If improperly designed, mechanical wafer clamps may also produce particulates with resulting contamination of the wafer as well as other problems.

An electrostatic chuck (ESC) uses an electrostatic potential to hold a wafer in place during processing, thus avoiding the problems of mechanical clamping by having contact with only the back side of the wafer. Electrostatic chucks operate by inducing opposing charges on the substrate and the chuck thereby resulting in an electrostatic attraction between the chuck and the substrate. A degree of attraction is dependent on an amount of charge induced as well as a rate at which the charge dissipates due to conductive effects. Voltage biasing is employed to induce and control the electrostatic force and may be applied for only a portion of a processing cycle, for example, just after a substrate is transferred to the chuck. Alternatively, voltage biasing may be applied continuously throughout a processing cycle. For instance, using the conduction properties of plasma can provide a means of electrical connection to one terminal of a ESC and wafer system.

Various types of electrostatic chucks may include consumable (i.e., sacrificial) edge rings positioned below and around the substrate for purposes of confining plasma to the area immediately proximate to and above the substrate. The edge rings may also protect the ESC from erosion by the plasma.

With reference to FIG. 1, a portion of an exemplary prior art ESC structure 100 includes an anodized aluminum base 101, a heater bond layer 103, a heater 105, a heater plate 107, and a ceramic bond layer 109. The ESC structure 100 is capped with a ceramic top piece 111. The heater bond layer 103, heater 105, heater plate 107, and ceramic bond layer 109 are protected from direct contact with a surrounding plasma environment and caustic chemicals by an edge bonding seal 113. The edge bonding seal 113 thus protects the heater 105, the heater plate 107, and the heater 103 and ceramic 109 bonding layers from plasma erosion.

The heater bond layer 103 is typically comprised of a silicone layer impregnated with silica (e.g., amorphous $SiO_x$). The heater 105 is frequently comprised of metallic resistance elements encapsulated in a polyimide while the heater plate 107 is typically fabricated from aluminum. A ceramic-filled (e.g., alumina ($Al_2O_3$)) silicone material is commonly employed for the ceramic bond layer 109. The ceramic top piece 111 is commonly fabricated from alumina and is configured to allow a substrate 115, such as a silicon wafer, to be securely held in place over the ceramic top piece 111.

An edge ring 117 is typically circular in overall shape and is secured to a periphery of an inner portion of the exemplary prior art ESC structure 100. The edge ring 117 is placed concentrically about the inner portion of the ESC structure 100 and features a vertical, single-surface inner diameter. The single-surface inner diameter constrains the edge ring 117 against the aluminum base 101, the edge bonding seal 113, and the ceramic top piece 111 thus nominally centering the edge ring 117.

Moreover, the edge ring 117 depends upon both critical tolerances and concentricity of at least the aluminum base 101 and the ceramic top piece 111. Any variation in either the tolerance of either piece or the concentricity may lead to breakage of the edge ring 117 upon either installation or use. Thus, the edge ring 117 must accommodate an overall worst-case tolerance between at least the aluminum base 101 and the ceramic top piece 111. Conversely, if the tolerances of the two pieces are not at a worst case condition, then the edge ring 117 is oversized and unable to adequately enhance process conditions with regard to the substrate. Therefore, the edge ring must be designed to accommodate worst case tolerances while still not being oversized in order to minimize yield impacts, decrease total tool operating costs, and improve overall performance of plasma-based processes.

Therefore, what is needed is an edge ring that may be easily applied to an ESC. The edge ring should be readily centered around the ESC and not require overly tight design tolerances while still maintaining well-centered concentricity about the ESC over a wide range of temperatures.

SUMMARY

In an exemplary embodiment, a device for use with an electrostatic chuck configured to hold a substrate in a plasma environment is disclosed. The device comprises an edge ring being configured to be placed around an outer periphery of a ceramic top piece of the electrostatic chuck and coupled to at least portions of only the ceramic top piece. The edge ring is further configured to be concentric with the ceramic top piece. The edge ring comprises an inner edge having an edge step arranged to provide mechanical coupling between the edge ring and the outer periphery of the ceramic top piece, an outer edge, and a flat portion located between the inner edge and the outer edge. The flat portion is arranged to be both horizontally oriented when the edge ring is placed around the outer periphery of the ceramic top piece and parallel to the substrate when in operation within the plasma environment.

In another exemplary embodiment, a device for use with an electrostatic chuck configured to hold a substrate in a plasma environment is disclosed. The device comprises an edge ring being configured to be placed around an outer periphery of a base plate of the electrostatic chuck and coupled to at least portions of only the base plate. The edge ring is further configured to be concentric with the base plate. The edge ring comprises an inner edge having an edge step arranged to provide mechanical coupling between the edge ring and the outer periphery of the base plate, an outer edge, and a flat portion located between the inner edge and the outer edge. The flat portion is arranged to be both horizontally oriented when the edge ring is placed around the outer periphery of the base plate and parallel to the substrate when in operation within the plasma environment.

In another exemplary embodiment, a device for use with an electrostatic chuck configured to hold a substrate in a plasma environment is disclosed. The device comprises an edge ring configured to be coupled to a base plate of the electrostatic chuck through a plurality of pins. A plurality of pin slots is arranged near a periphery of the edge ring and configured to be placed over the plurality of pins and center the edge ring concentrically with the electrostatic chuck. The plurality of pin slots is further configured to allow variations in thermal expansion between the edge ring and the base plate while still maintaining the concentric centering of the edge ring.

In another exemplary embodiment, a device for use with an electrostatic chuck configured to hold a substrate in a plasma environment is disclosed. The device comprises an edge ring configured to be coupled to a base plate of the electrostatic chuck through a plurality of pins. A plurality of pin slots is arranged near a periphery of the base plate and configured to be placed over the plurality of pins and center the edge ring concentrically with the electrostatic chuck. The plurality of pin slots is further configured to allow variations in thermal expansion between the edge ring and the base plate while still maintaining the concentric centering of the edge ring.

BRIEF DESCRIPTION OF THE DRAWINGS

Various ones of the appended drawings merely illustrate exemplary embodiments of the present invention and must not be considered as limiting its scope.

DETAILED DESCRIPTION

Various embodiments discussed below describe an improved edge ring designed to enhance process performance. Process performance is enhanced by ensuring the edge ring is placed concentrically (i.e., centered) about an aluminum base piece or ceramic top piece of an ESC, thus resulting in the edge ring being arranged precisely and accurately about a substrate.

Figure 2A:
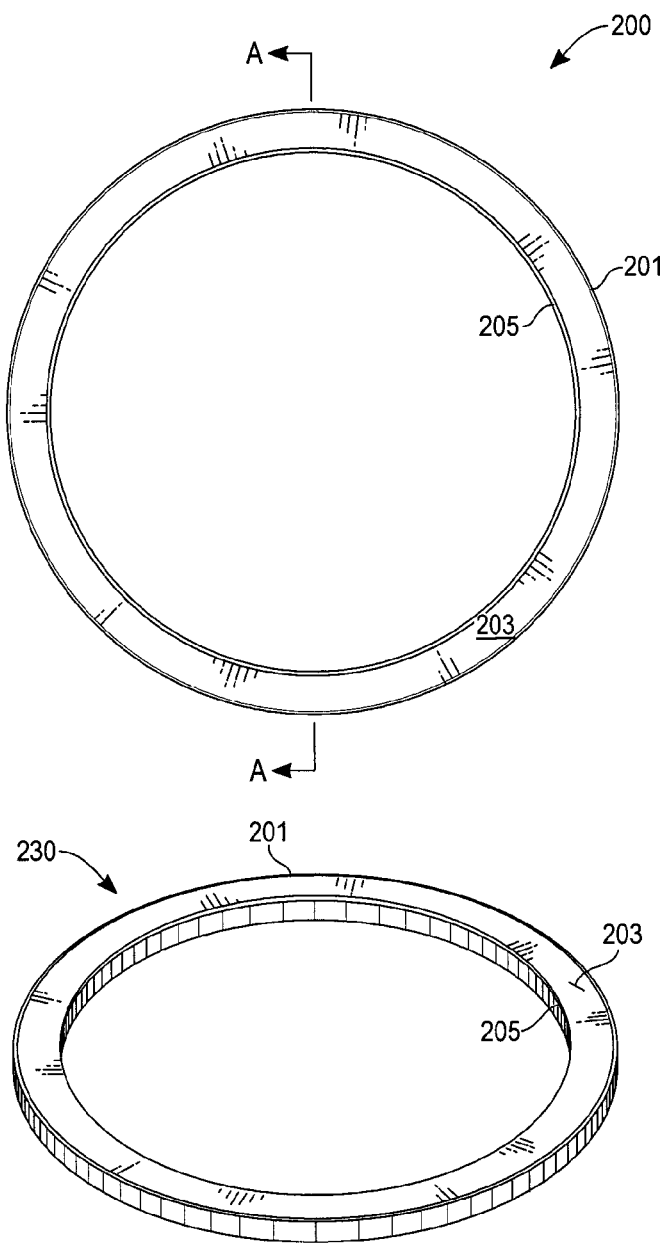
FIG. 2A includes both an exemplary top view and an accompanying isometric view of a shoulder-centered edge ring of the present invention.

With reference to FIG. 2A, a plan view 200 of an exemplary embodiment of a shoulder-centered edge ring 201 includes a stepped inner diameter shape 205 and a substantially flat top surface 203. In use, the shoulder-centered edge ring 201 surrounds an ESC structure (not shown but readily understandable to one skilled in the art) with the flat top surface 203 being substantially horizontal and parallel to a substrate placed on the ESC. An isometric view 230 provides an additional reference view of the shoulder-centered edge ring 201.

The stepped inner diameter shape 205 improves centering about the ESC structure since the shoulder-centered edge ring 201 contacts only the ceramic top piece of the ESC. The shoulder-centered edge ring 201 may be friction fit about the ceramic top piece or, alternatively, held in place with adhesives or mechanical fasteners known independently in the art. In a specific exemplary embodiment, the stepped inner diameter shape 205 is approximately 1.9 mm (approximately 0.075 inches) high and 0.4 mm wide (approximately 0.016 inches) wide. More specific details are provided below. Overall, the stepped inner diameter shape 205 of the shoulder-centered edge ring 201 provides approximately a 50% improvement in edge ring centering resulting ultimately in improved process performance.

Figure 2B:
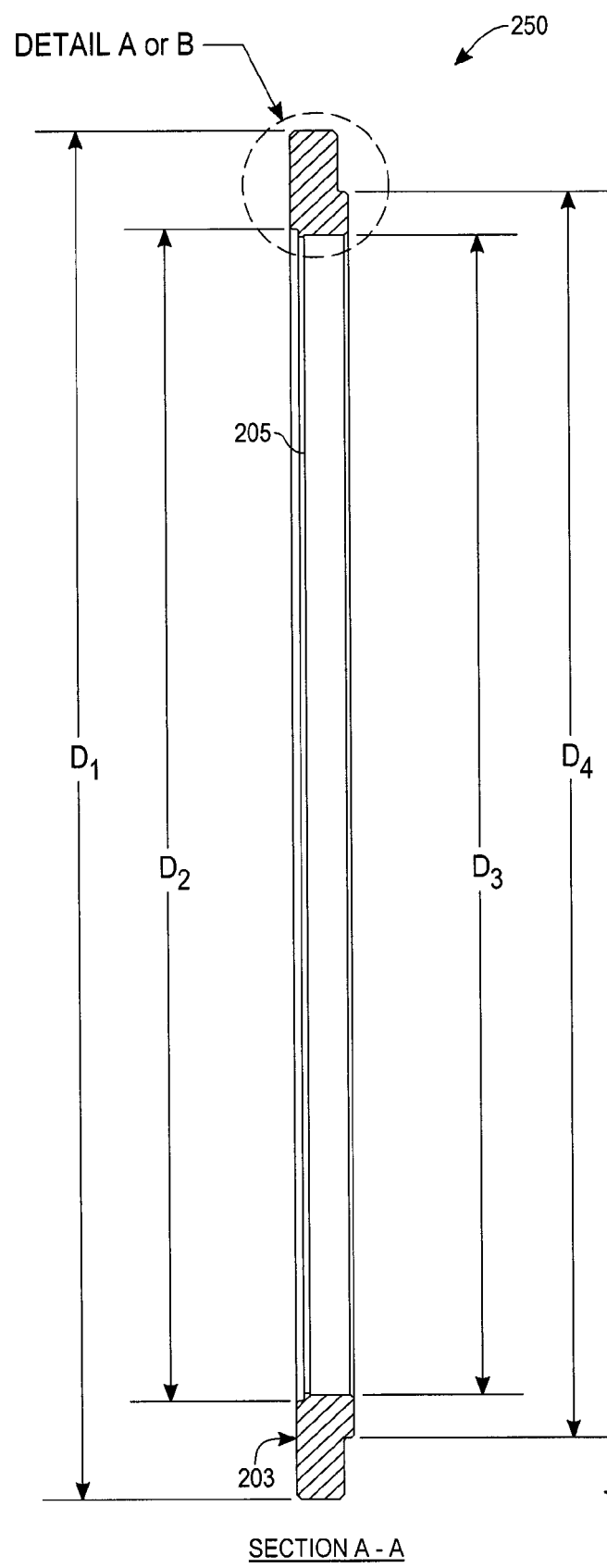
FIG. 2B is a cross-sectional view of the shoulder-centered edge ring of FIG. 2A.

Referring now to FIG. 2B, a cross-sectional view 250 of the shoulder-centered edge ring 201 is shown at section A-A. The shoulder-centered edge ring 201 may be formed from a variety of materials such as aluminum oxide ($Al_2O_3$, "alumina") or other type of ceramic. Silicon, silicon carbide, silicon dioxide (e.g., crystalline or amorphous ($SiO_x$)), and transitional metals such as solid yttrium are also suitable materials from which to fabricate the shoulder-centered edge ring 201. Additionally, various other types of metallic, insulating, and semiconducting materials may also be readily employed. Thermal expansion compatibility between the shoulder-centered edge ring 201 and the ceramic over, for example, a 100° C. temperature range may need to be considered if the shoulder-centered edge ring 201 is designed to provide a friction fit with the ceramic of the ESC. In a typical application, the shoulder-centered edge ring 201 may be machined to have a proper press-fit at ambient temperature (e.g., 20° C.).

In a specific exemplary embodiment, the shoulder-centered edge ring 201 is fabricated from aluminum oxide ($Al_2O_3$) and coated with an yttrium oxide finish 75 micrometers (μm) to 125 μm (approximately 0.003 to 0.005 inches) in thickness. The yttrium oxide finish may be applied by, for example, thermo-spraying or applied from a physical vapor deposition (PVD) system. In this embodiment, the yttrium oxide finish may taper in certain areas as required or entire portions of the shoulder-centered edge ring 201 may be left uncoated.

With continued reference to FIG. 2B, specific exemplary dimensions are given in Table I, below, to accommodate a 300 mm diameter substrate.

TABLE I

| Dimension | Size (mm) | Tolerance (mm) | Size (inches) | Tolerance (inches) |
|---|---|---|---|---|
| $D_1$ | 351.03 | 0.05 | 13.820 | 0.002 |
| $D_2$ | 301.37 | 0.05 | 11.865 | 0.002 |
| $D_3$ | 297.97 | 0.05 | 11.731 | 0.002 |
| $D_4$ | 320.39 | 0.08 | 12.610 | 0.003 |

The exemplary dimensions are provided merely to aid a skilled artisan in fully understanding fabrication details of the shoulder-centered edge ring 201. The dimensions given may be suitably scaled for other common substrate sizes (e.g., 200 mm or 450 mm diameter wafers or rectangular sections of flat panel displays).

Figure 1:
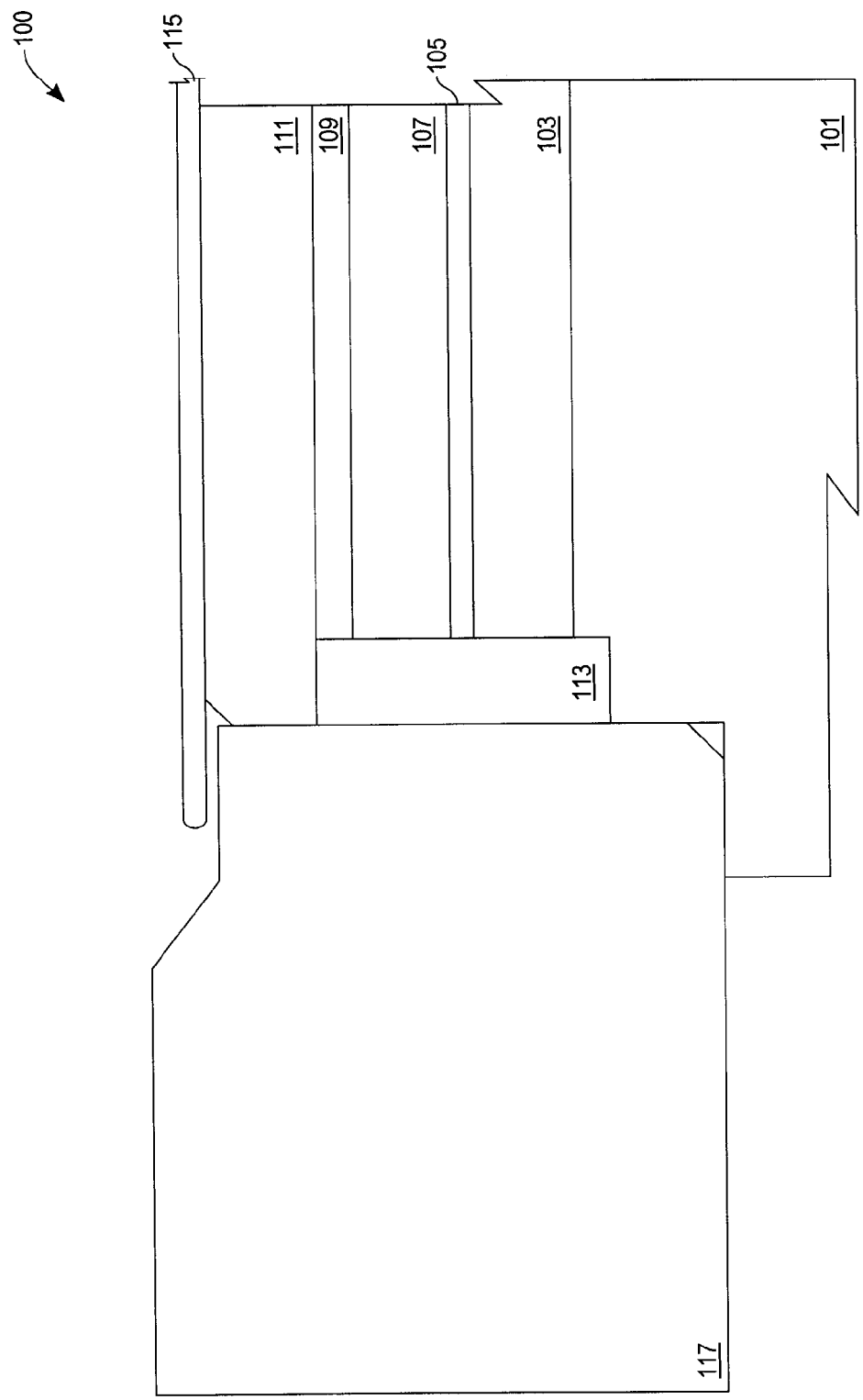
FIG. 1 is a cross-sectional view of a portion of a prior art electrostatic chuck.
Figure 2C:
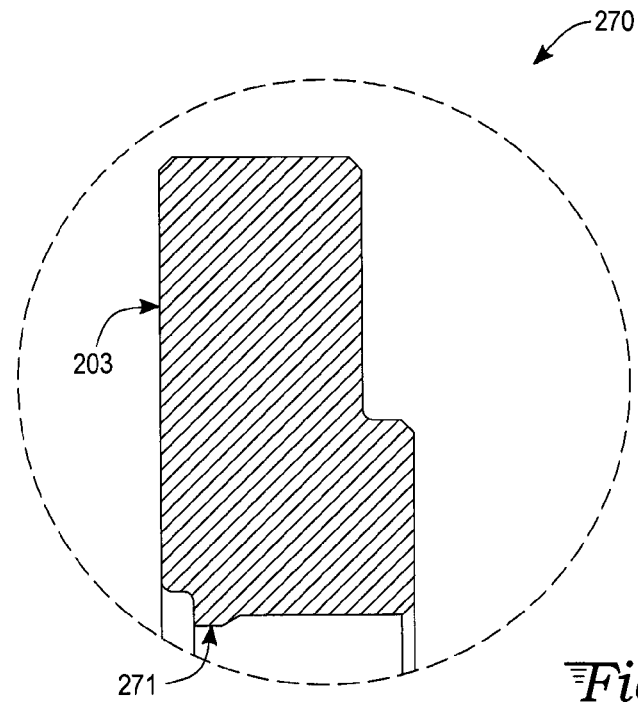
FIG. 2C is a magnified portion of the edge ring of FIG. 2B showing a specific exemplary shoulder design.

Referring now to FIG. 2C, an enlarged section 270 of section A-A of FIG. 2B provides details of a specific exemplary embodiment of a first edge step 271. The first edge step 271 is designed to mechanically contact at least portions of only the ceramic top piece 111 (FIG. 1) of a typical ESC. The first edge step 271 thus provides a gap of approximately 0.4 mm (about 0.016 inches) between the shoulder-centered edge ring 201 and the aluminum base plate 101 of the ESC while being precisely and accurately centered about the ceramic top piece 111.

Figure 2D:
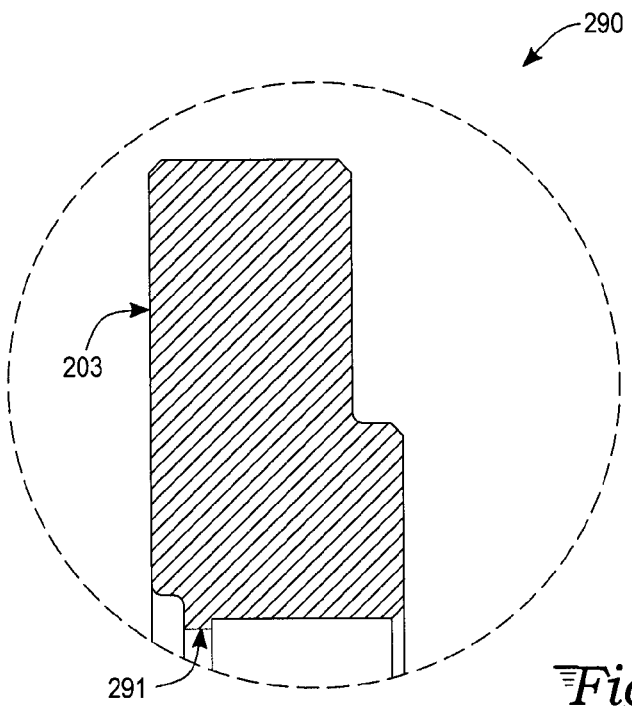
FIG. 2D is a magnified portion of the edge ring of FIG. 2B showing another specific exemplary shoulder design.

With reference to FIG. 2D, another enlarged section 290 provides details of another specific exemplary embodiment of a second edge step 291. Dimensions of the second edge step 291 are similar to the first edge step 271 described immediately above and function in a similar fashion. A skilled artisan may readily envision a variety of other shapes an edge step could take based on the information provided herein.

Figure 3A:
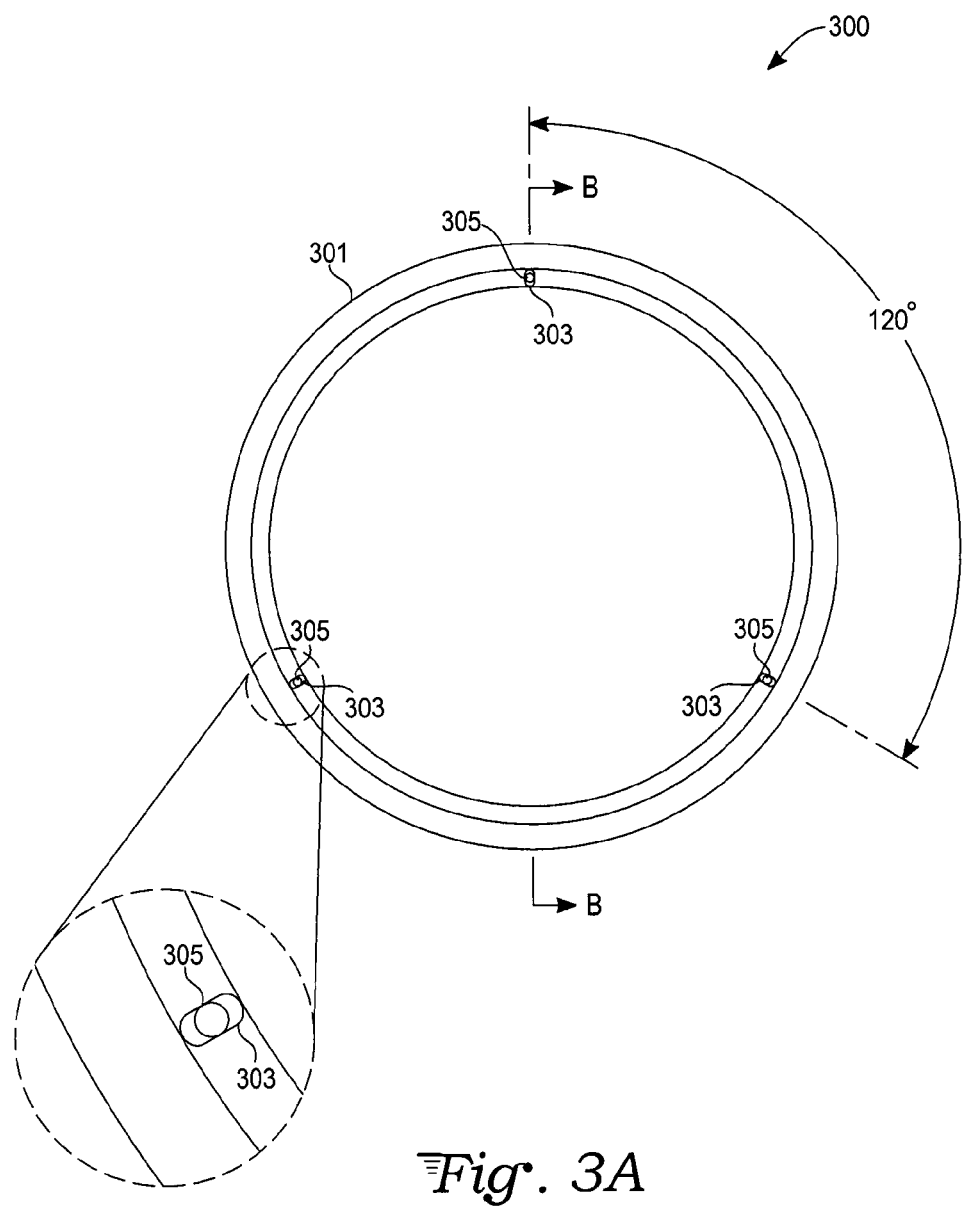
FIG. 3A is a bottom view of an exemplary pin-centered edge ring of the present invention.

In FIG. 3A, a bottom view 300 of a pin-centered edge ring 301 includes a plurality of pin slots 303 arranged to fit over or around a plurality of pins 305. In this exemplary embodiment, the plurality of pin slots are spaced at approximately 120° intervals for a total of three slots. In other exemplary embodiments (not shown), a smaller or larger number of the plurality of pin slots 303 may be incorporated into the pin-centered edge ring 301.

Each of the plurality of pins is mounted into the aluminum base plate portion (not shown, but readily envisioned from FIG. 1) of the ESC. The plurality of pins 305 is sized to provide a press-fit of the pin-centered edge ring 301 thereby centering the edge ring around a periphery of the main portion of the ESC. The elongated nature of the plurality of pin slots 303 however allows for variations in thermal expansion of the pin-centered edge ring 301 and the aluminum base plate.

In another embodiment (not shown but readily understood to one of skill in the art), each of the plurality of pins 305 may be affixed to the pin-centered edge ring 301 and a plurality of pin slots may be machined into the aluminum base plate. In still another embodiment, the plurality of pins 305 may be machined directly as a portion of either the pin-centered edge ring 301 or the aluminum base plate.

If the plurality of pins 305 are "loose" (i.e., not machined as a portion of either the pin-centered edge ring 301 or the aluminum base plate), the plurality of pins 305 may be fabricated from a variety of materials. The materials include stainless steel (e.g., 316L), high-temperature plastics, aluminum oxide or other ceramics, solid yttrium, or a number of other materials known in the art that are capable of both being machined and withstanding relatively high temperatures (up to, for example, 400° C. or more).

Figure 3B:
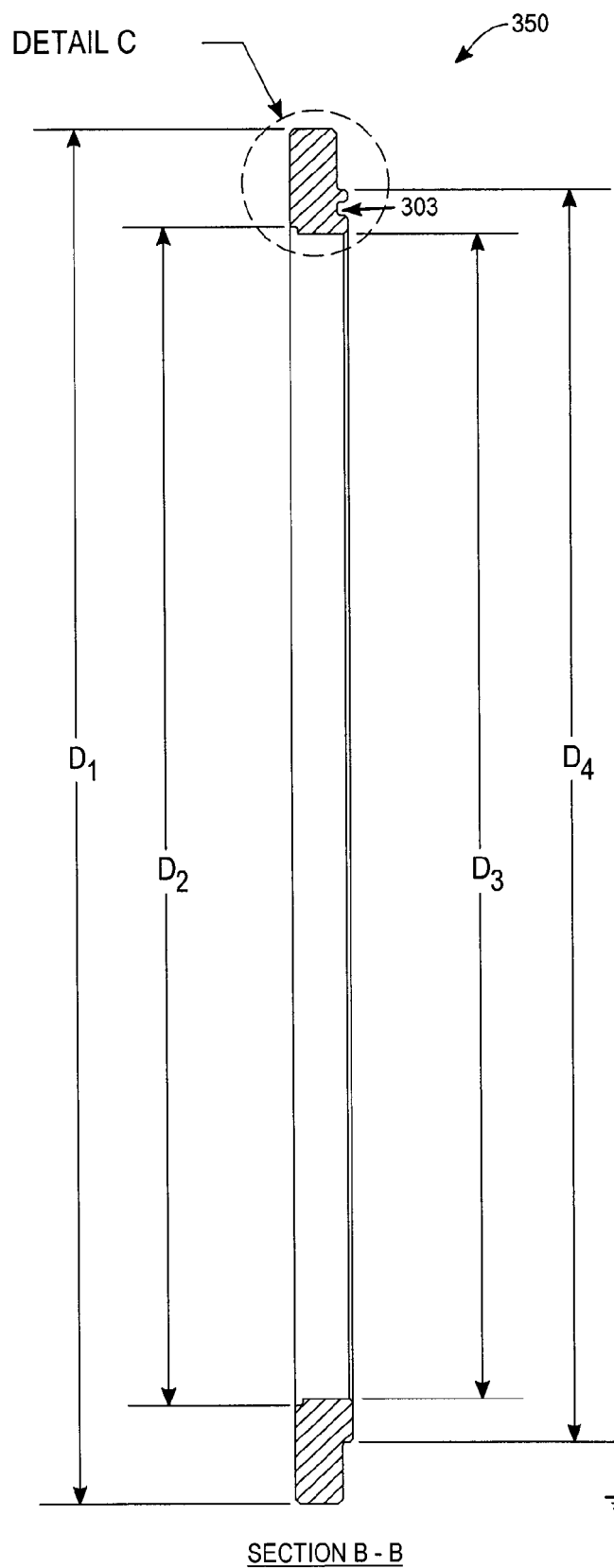
FIG. 3B is a cross-sectional view of the pin-centered edge ring of FIG. 3A.

Referring now to FIG. 3B, a cross-sectional view 350 of the pin-centered edge ring 301 is shown at section B-B. The cross-sectional view 350 indicates a location of one of the plurality of pin slots 303.

The pin-centered edge ring 301 may be formed from a variety of materials such as aluminum oxide ($Al_2O_3$, "alumina") or other type of ceramic. Silicon, silicon carbide, silicon dioxide (e.g., crystalline or amorphous ($SiO_x$)), and transitional metals such as solid yttrium are also suitable materials from which to fabricate the pin-centered edge ring 301. Additionally, various other types of metallic, insulating, and semiconducting materials may also be readily employed.

Thermal expansion compatibility between the pin-centered edge ring 301 and the aluminum base plate over, for example, a 100° C. temperature range will generally be automatically compensated for by the elongated nature of the plurality of pin slots 303 while still maintaining concentric centering with the ESC. In a typical application, the pin-centered edge ring 301 may be machined to have a proper press-fit at ambient temperature (e.g., 20° C.).

In a specific exemplary embodiment, the pin-centered edge ring 301 is fabricated from aluminum oxide ($Al_2O_3$) and coated with an yttrium oxide finish 75 micrometers ($\mu m$) to 125 $\mu m$ (approximately 0.003 to 0.005 inches) in thickness. The yttrium oxide finish may be applied by, for example, thermo-spraying or applied from a physical vapor deposition (PVD) system. In this embodiment, the yttrium oxide finish may taper in certain areas as required or entire portions of the pin-centered edge ring 301 may be left uncoated.

With continued reference to FIG. 3B, specific exemplary dimensions are given in Table I, above, to accommodate a 300 mm diameter substrate. The exemplary dimensions are provided merely to aid a skilled artisan in fully understanding fabrication details of the pin-centered edge ring 301. The dimensions given may be suitably scaled for other common substrate sizes (e.g., 200 mm or 450 mm diameter wafers).

Figure 3C:
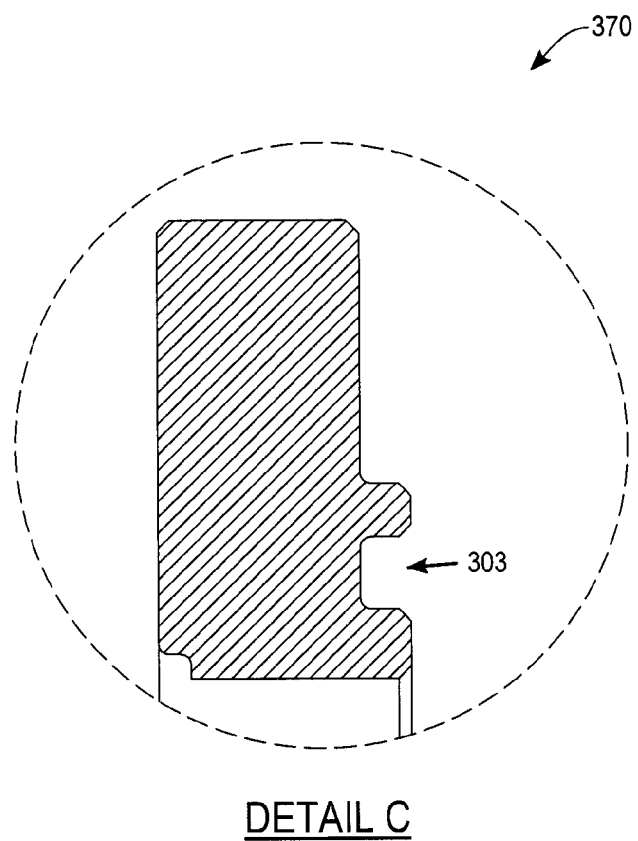
FIG. 3C is a magnified portion of the edge ring of FIG. 3B showing a specific exemplary pin centering design.

Referring now to FIG. 3C, an enlarged section 370 of section B-B of FIG. 3B provides details of a specific exemplary embodiment of one of the plurality of pin slots 303. The pin-centered edge ring 301 is designed to mechanically contact only the aluminum base plate 101 (FIG. 1) of a typical ESC and the plurality of pins 305. The plurality of pin slots 303 and the plurality of pins 305 may be machined to provide a gap of approximately 0.4 mm (about 0.016 inches) between the pin-centered edge ring 301 and the ceramic top piece 111. Additionally, although the plurality of pin slots is shown as a blind hole construction, a skilled artisan will readily recognize that a through-hole configuration may be used as well.

The present invention is described above with reference to specific embodiments thereof. It will, however, be evident to a skilled artisan that various modifications and changes can be made thereto without departing from the broader spirit and scope of the present invention as set forth in the appended claims.

For example, particular embodiments describe various material types and placements. A skilled artisan will recognize that these materials and placements may be varied and those shown herein are for exemplary purposes only in order to illustrate various aspects of the described edge ring. For example, upon reading the information disclosed herein, a skilled artisan will quickly recognize that the shoulder-centered embodiment of the edge ring could be placed about the ESC base plate as well without touching the ceramic top piece. Additionally, a skilled artisan will further recognize that the techniques and methods described herein may be applied to any similar sort of structure operating in a harsh plasma and chemical environment in which precise and accurate concentricity and placement need to be maintained. The application to an electrostatic chuck of the semiconductor industry is purely used as an exemplar to aid one of skill in the art in describing various embodiments of the present invention.

Moreover, the term semiconductor should be construed throughout the description to include data storage, flat panel display, as well as allied or other industries. These and various other embodiments are all within a scope of the present invention. The specification and drawings are, accordingly, to be regarded in an illustrative rather than a restrictive sense.

What is claimed is:

1. A device for use with an electrostatic chuck configured to hold a substrate in a plasma environment, the device comprising:
    an edge ring, configured to be placed around an outer periphery of a ceramic top piece of the electrostatic chuck and directly coupled to at least portions of only the ceramic top piece, the edge ring being further configured to be concentric with the ceramic top piece, the edge ring comprising:
        an inner edge having an edge step directed towards an interior portion of the edge ring and arranged to provide a direct mechanical connection between the edge ring and the outer periphery of the ceramic top piece;
        an outer edge; and
        a substantially flat uppermost portion located between the inner edge and the outer edge, the substantially flat uppermost portion arranged to be both horizontally oriented when the edge ring is placed around the outer periphery of the ceramic top piece and parallel to the substrate when in operation within the plasma environment.

2. The device of claim 1 wherein the edge ring is at least partially fabricated from solid yttrium.

3. The device of claim 1 wherein the edge ring is at least partially fabricated from aluminum oxide.

4. The device of claim 3 wherein the aluminum oxide is at least partially coated with yttrium oxide.

5. The device of claim 1 wherein the edge ring is fabricated to provide a friction fit about the ceramic top piece of the electrostatic chuck.

6. The device of claim 5 wherein the friction fit is configured to be maintained over a temperature range of approximately 100° C.

7. The device of claim 1 wherein the edge step extends from the inner edge of the edge ring radially inward approximately 0.4 millimeters.

8. The device of claim 1 wherein an inner portion of the edge step extends parallel to the inner edge of the edge ring approximately 1.9 millimeters.

9. A device for use with an electrostatic chuck configured to hold a substrate in a plasma environment, the device comprising:
    an edge ring, configured to be placed around an outer periphery of a base plate of the electrostatic chuck and directly coupled to at least portions of only the base plate, the edge ring further configured to be concentric with the base plate, the edge ring comprising:
        an inner edge having an edge step directed towards an interior portion of the edge ring and arranged to provide a direct mechanical connection between the edge ring and the outer periphery of the base plate;
        an outer edge; and
        a substantially flat uppermost portion located between the inner edge and the outer edge, the substantially flat uppermost portion arranged to be both horizontally oriented when the edge ring is placed around the outer periphery of the base plate and parallel to the substrate when in operation within the plasma environment.

10. The device of claim 9 wherein the edge ring is at least partially fabricated from solid yttrium.

11. The device of claim 9 wherein the edge ring is at least partially fabricated from aluminum oxide.

12. The device of claim 11 wherein the aluminum oxide is at least partially coated with yttrium oxide.

13. The device of claim 9 wherein the edge ring is fabricated to provide a friction fit about the base plate of the electrostatic chuck.

14. The device of claim 13 wherein the friction fit is configured to be maintained over a temperature range of approximately 100° C.

15. The device of claim 9 wherein the edge step extends from the inner edge of the edge ring radially inward approximately 0.4 millimeters.

16. The device of claim 9 wherein an inner portion of the edge step extends parallel to the inner edge of the edge ring approximately 1.9 millimeters.

17. A device for use with an electrostatic chuck configured to hold a substrate in a plasma environment, the device comprising:
    an edge ring configured to be coupled to at least portions of only a base plate of the electrostatic chuck through a plurality of pins formed on the base plate;
    a plurality of pin slots arranged near an inner edge of a periphery of the edge ring and configured to be placed over the plurality of pins and center the edge ring concentrically with the electrostatic chuck, the plurality of pin slots further configured to allow variations in thermal expansion between the edge ring and the at least portions of only the base plate while still maintaining the concentric centering of the edge ring.

18. The device of claim 17 wherein the plurality of pin slots are arranged as a blind-hole construction.

19. The device of claim 17 wherein the plurality of pin slots are arranged as a through-hole construction.

20. The device of claim 17 wherein the edge ring is at least partially fabricated from solid yttrium.

21. The device of claim 17 wherein the edge ring is at least partially fabricated from aluminum oxide.

22. The device of claim 21 wherein the aluminum oxide is at least partially coated with yttrium oxide.

23. The device of claim 17 wherein the plurality of pin slots is fabricated to provide a friction fit at ambient temperature about the plurality of pins.

24. A device for use with an electrostatic chuck configured to hold a substrate in a plasma environment, the device comprising:
    an edge ring configured to be coupled to at least portions of only a base plate of the electrostatic chuck through a plurality of pins formed on the base plate;
    a plurality of pin slots arranged near an inner edge of a periphery of the base plate and configured to be placed over the plurality of pins and center the edge ring concentrically with the electrostatic chuck, the plurality of pin slots further configured to allow variations in thermal expansion between the edge ring and the at least portions of only the base plate while still maintaining the concentric centering of the edge ring.

25. The device of claim 24 wherein the plurality of pin slots are arranged as a blind-hole construction.

26. The device of claim 24 wherein the plurality of pin slots are arranged as a through-hole construction.

27. The device of claim 24 wherein the edge ring is at least partially fabricated from solid yttrium.

28. The device of claim 24 wherein the edge ring is at least partially fabricated from aluminum oxide.

29. The device of claim 28 wherein the aluminum oxide is at least partially coated with yttrium oxide.

30. The device of claim 24 wherein the plurality of pin slots is fabricated to provide a friction fit at ambient temperature about the plurality of pins.

* * * * *

UNITED STATES PATENT AND TRADEMARK OFFICE
CERTIFICATE OF CORRECTION

PATENT NO. : 8,469,368 B2  
APPLICATION NO. : 12/540186  
DATED : June 25, 2013  
INVENTOR(S) : Kenworthy et al.

Page 1 of 1

It is certified that error appears in the above-identified patent and that said Letters Patent is hereby corrected as shown below:

In the Specification

In column 4, line 22, after "inches)", delete "wide", therefor

In the Claims

In column 7, line 5, in Claim 1, after "ring", delete ",", therefor

In column 7, line 46, in Claim 9, after "ring", delete ",", therefor

Signed and Sealed this  
Third Day of December, 2013

Margaret A. Focarino  
*Commissioner for Patents of the United States Patent and Trademark Office*